United States Patent

Kawase

[11] Patent Number: 5,828,953
[45] Date of Patent: Oct. 27, 1998

[54] MOBILE RADIO COMMUNICATION APPARATUS ADAPTABLE TO POWER SUPPLY VOLTAGE CHANGE

[75] Inventor: Kouichi Kawase, Hyogo-ken, Japan

[73] Assignee: Mitsubishi Denki Kabushiki Kaisha, Tokyo, Japan

[21] Appl. No.: 861,520

[22] Filed: May 22, 1997

Related U.S. Application Data

[63] Continuation of Ser. No. 366,043, Dec. 29, 1994, abandoned.

[30] Foreign Application Priority Data

Jan. 27, 1994 [JP] Japan ................................. 6-007774

[51] Int. Cl.$^6$ .............................. H01Q 11/12; H04B 1/04
[52] U.S. Cl. ............................................ 455/127; 455/115
[58] Field of Search ................................... 455/115, 117, 455/126, 127, 38.3, 343, 68, 522, 572, 574, 575, 573; 330/278, 285, 296, 297

[56] References Cited

U.S. PATENT DOCUMENTS

| | | |
|---|---|---|
| 4,636,741 | 1/1987 | Mitzlaff . |
| 4,709,404 | 11/1987 | Tamura et al. . |
| 4,989,260 | 1/1991 | Meade ...................................... 455/127 |
| 5,029,298 | 7/1991 | Chiba et al. ............................ 455/127 |
| 5,101,507 | 3/1992 | Jung ........................................ 455/127 |
| 5,192,919 | 3/1993 | Wieczorek . |
| 5,239,694 | 8/1993 | Toyoshima .............................. 455/127 |
| 5,423,077 | 6/1995 | Ueda ....................................... 455/127 |

FOREIGN PATENT DOCUMENTS

| | | |
|---|---|---|
| 0392079 | 10/1990 | European Pat. Off. . |
| 1-314431 | 12/1989 | Japan . |
| 9302505 | 2/1993 | WIPO . |

*Primary Examiner*—Nguyen Vo
*Attorney, Agent, or Firm*—Rothwell, Figg, Ernst & Kurz

[57] ABSTRACT

A mobile radio communication apparatus powered by a limited-capacity power supply includes a transmission amplifier producing a transmission output in accordance with command data from a base station. The driving voltage for the amplifier from the power supply may change due to the lapse of time. A memory stores control data for maintaining a desired operation of the amplifier with the dissipation current thereof minimized when the power supply voltage changes. The driving range of the amplifier is controlled in accordance with the stored control data.

7 Claims, 7 Drawing Sheets

| THRESHOLD DATA | $V_{TH}$ |
|---|---|
| DRIVING VOLTAGE CONTROL DATA | A ($V_D \geq V_{TH}$) <br> B ($V_D < V_{TH}$) |

| THRESHOLD DATA | $V_{THn}$ (n = 1, 2, 3 ··· n) |
|---|---|
| DRIVING VOLTAGE CONTROL DATA | $M_1$ ($V_D > V_{TH1}$)<br>$M_2$ ($V_{TH1} \geqq V_D > V_{TH2}$)<br>$M_3$ ($V_{TH2} \geqq V_D > V_{TH3}$)<br>⋮<br>$M_{n+1}$ ($V_D \leqq V_{THn}$) |

MOBILE RADIO COMMUNICATION APPARATUS ADAPTABLE TO POWER SUPPLY VOLTAGE CHANGE

This is a continuation of application Ser. No. 08/366,043, filed Dec. 29, 1994, now abandoned.

BACKGROUND OF THE INVENTION

1. Field of the Invention

This invention relates to a mobile radio communication apparatus capable of providing a transmission output with a predetermined level in accordance with command data from a base station even if the voltage of a power supply changes.

2. Description of the Prior Art

As is known in the art, the output level of a transmitted signal from a mobile radio communication apparatus is changed in accordance with the distance from a base station with which the mobile radio communication apparatus is in communication and the operational conditions. For example, Japanese Patent Laid-Open No. 314,431/1989 discloses that the output level of a power module providing a transmitted signal is controlled by a multiplexer which selects one of six steps.

In the prior art mobile radio system, the operation range of a transmitting amplifier is limited and a high level output cannot be obtained as the driving voltage applied to the amplifier becomes lower due to long-time use since capacity of a charged battery such as a battery pack used for a radio communication device installed in a vehicle or a portable radio communication device is limited.

It is possible to set to be small the absolute value of the driving voltage applied to the gate electrode of a transmitting amplifier from a negative voltage supply so that a high level transmission output can be obtained after the positive driving voltage from the battery begins to lower. However, such a method may cause a drawback that the dissipating current of the transmitting amplifier increases when the driving voltage from the battery is not lowered and is relatively high if the driving voltage from the negative voltage supply is made small in its absolute value, that is, made close to the ground potential from the initial time in order to maintain the operational range of the amplifier to be broad. The increase in the dissipating current may result in the destruction of the amplifier due to high energy loss, although a high level transmission output is obtained. Further, since the increase in the dissipating current causes an adverse effect on the transmission output by changing the current amplification factor, the effect of the high energy loss should be reduced by, for example, providing a heat sink in the radio device. Such a heat sink is not suitable for the mobile radio device for which a small size and light weight is desirable.

In the prior art, the driving voltage from the negative voltage supply was adjusted in such a manner that the current amplification factor of the transmitting amplifier is not adversely affected. When the mobile radio communication apparatus is distant from the base station such that a desired transmission output is no longer obtained and the communication is impossible, the battery was replaced with a new battery.

However, it is desirable to use the radio communication apparatus for a long time without replacing a battery, in particular when the apparatus is installed in a vehicle or portable device.

As explained above, the prior art mobile radio communication apparatus has a problem that the operation range of a transmission amplifier is limited and a high level transmission output cannot be obtained when the driving voltage applied to the transmission amplifier by a power supply becomes lower due to long-time use in a case of using a capacity-limited power supply such as a battery pack.

If the driving voltage from a negative voltage applied to the transmission amplifier is previously made small in absolute to broaden the operating range of the amplifier in order to resolve the above problem, the dissipating current of the amplifier increases when the driving voltage from the battery pack affords a relatively high voltage and the amplifier may be broken down due to the energy loss at a high level transmission output.

SUMMARY OF THE INVENTION

In view of the problems explained above, it is an object of the present invention to provide a mobile radio communication apparatus capable of producing a transmission output with a desired high level by adjusting the operating range of a transmission amplifier in accordance with the driving voltage of a power supply and command data from a base station even if the power supply driving voltage decreases and keeping the dissipating current of the amplifier to a minimum during the transmission regardless of any increase or decrease in the driving voltage, the driving voltage being provided by a limited-capacity power supply such as a battery pack.

According to a first feature of the present invention, a mobile radio communication apparatus comprises a power supply section, a transmission amplifier being provided with a driving voltage from the power supply section and producing a transmission output, a memory section storing reference data for evaluating the driving voltage from the power supply section and control data for controlling the driving range of the amplifier, a control section comparing voltage data based on the driving voltage detected from the power supply section with the reference data stored in the memory section and reading the corresponding control data out of the memory section in accordance with the comparison, and a driving range control means for receiving the read out control data and controlling the driving range of the amplifier in accordance with the control data.

The mobile radio communication apparatus in accordance with the first feature stores the control data for suitably adjusting the driving range of the transmission amplifier on the basis of the driving voltage of the power supply section and actually controls the driving range of the amplifier in accordance with the stored control data. Thus, a desired transmission output can be obtained even if the driving voltage decreases and the dissipating current of the amplifier is always made minimum.

According to a second feature of the present invention, a mobile radio communication apparatus comprises a power supply section, a transmission amplifier being provided with a driving voltage from the power supply section and producing a transmission output, an automatic output control means for adjusting the transmission output of the amplifier in accordance with command data from a base station, a memory section storing control data for adjusting the driving range of the amplifier for each of the command data, each of the control data corresponding to each of the command data, a control section reading a desired one of control data out of the memory section in accordance with the command data from the base station and voltage data based on the driving voltage detected from the power supply section, and a driving range control means for receiving the control data read out by the control section and controlling the driving range of the amplifier in accordance with a control voltage based on the control data.

The mobile radio communication apparatus in accordance with the second feature stores the control data which are set on the basis of the driving voltage from the power supply and the command data from the base station for adjusting the driving range of the amplifier, and actually controls the driving range of the amplifier in accordance with the stored control data. Thus, a desired transmission output can be obtained even if the driving voltage lowers and the dissipating current of the amplifier is kept minimum even if the transmission output is changed by the command signal from the base station.

According to a third feature of the present invention, a mobile radio communication apparatus adapted for use as a portable apparatus or an apparatus installed in a vehicle, the apparatus comprising a portable power supply, a transmission amplifier producing a transmission output, the amplifier being provided with a driving voltage from the portable power supply or an on-board power supply disposed within the vehicle, a power supply switching section connected to the on-board power supply for selectively providing the transmission amplifier with the driving voltage of the on-board power supply or separating the on-board power supply and providing the amplifier with the driving voltage of the portable power supply, a memory section storing control data for adjusting the driving range of the amplifier on the basis of the driving voltage of the portable power supply or the on-board power supply, a control section for retrieving the control data corresponding to voltage data produced on the basis of the driving voltage detected from the portable or on-board power supply, and a driving range control means for receiving the control data retrieved by the control section and controlling the driving range of the amplifier in accordance with a control voltage based on the control data.

The mobile radio communication apparatus in accordance with the third feature stores in the memory section the control data which are set on the basis of the driving voltage from the portable power supply and the on-board power supply for adjusting the driving range of the amplifier, and actually controls the driving range of the amplifier in accordance with the stored control data. Thus, a desired transmission output can be obtained even if the driving voltage lowers during the communication energized by the portable power supply or the on-board power supply and the dissipating current of the amplifier is always minimized.

According to a fourth feature of the present invention, a mobile radio communication apparatus uses a lithium-ion-system chargeable battery for a power supply.

Since the lithium-ion-system chargeable battery is used, the driving voltage can be supplied to the amplifier for a long time with the dissipating current of the amplifier kept low.

BRIEF DESCRIPTION OF THE DRAWINGS

The foregoing features and other aspects of the invention are explained in the following detailed description in connection with the accompanying drawings wherein.

DETAILED DESCRIPTION OF THE PREFERRED EMBODIMENTS

A first embodiment of the present invention will be explained with reference to FIGS. 1 through 6, wherein a nickel-cadmium chargeable battery is used as a power supply. When a driving voltage of the power supply changes, a negative potential driving voltage supplied to a transmission amplifier from a negative power supply source is controlled in two steps. The internal voltage of a nickel-cadmium battery does not change remarkably with the lapse of time as explained later.

Figures 1, 2:
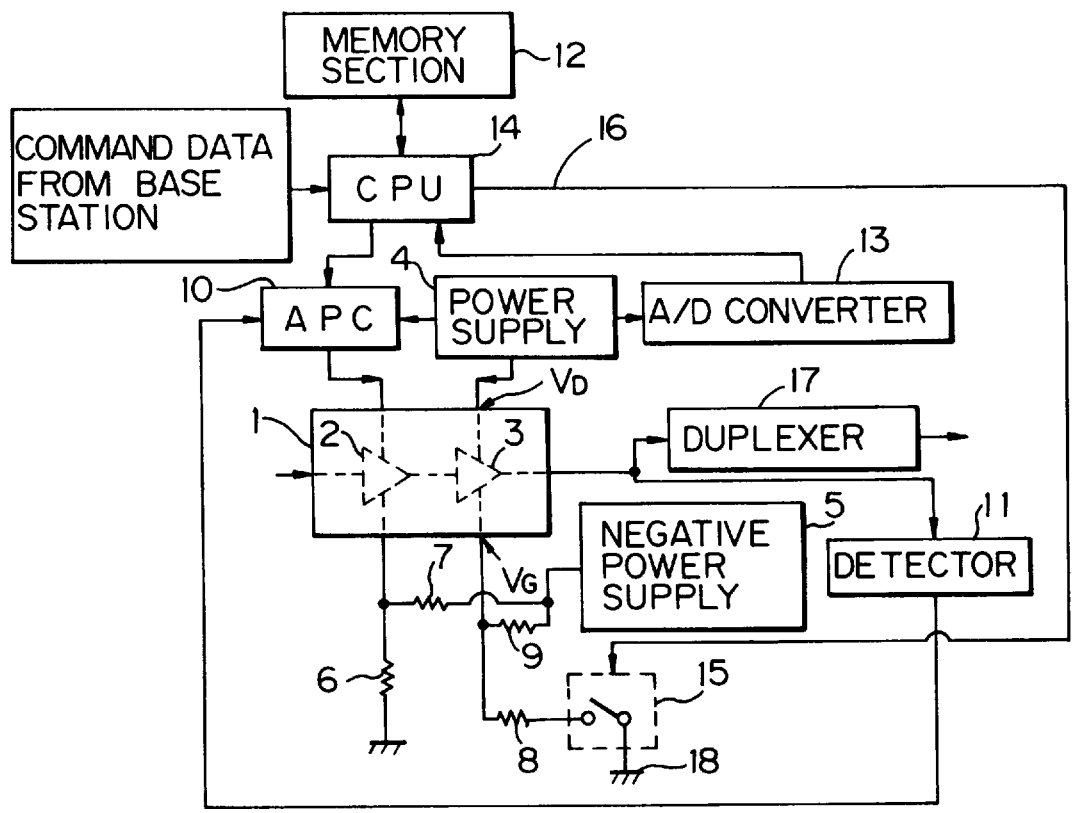
FIG. 1 is a structural block diagram illustrating a mobile radio communication apparatus according to an embodiment of the present invention.
FIG. 2 shows an example of control data for controlling a transmission amplifier.

FIG. 1 is a structural block diagram illustrating a mobile radio communication apparatus according to an embodiment of the present invention. In FIG. 1, the apparatus comprises a transmission amplifier 1 which is constituted of voltage-controlled amplifying elements such as gallium arsenide (GaAs) field effect transistor. The amplifier 1 includes a front stage amplifying device 2 and a rear stage amplifying device 3 and produces a transmission output. The rear stage amplifying device 3 is provided with a driving voltage VD at the drain side of the device 3 from a power supply section 4 which may be a nickel-cadmium chargeable battery. The apparatus further comprises a negative power supply section 5 supplying a negative potential to the amplifier 1 to set the driving range of the amplifier 1, and resistors 6, 7, 8 and 9. The resistors 6 and 7 divide the negative potential from the section 5 to supply a predetermined voltage to the gate side of the amplifying device 2. The resistors 8 and 9 also divide the negative potential to supply a predetermined voltage value to the gate side of the amplifying device 3. The negative potential divided by the resistors 8 and 9 is applied to the device 3 as a driving voltage $V_G$ correspondingly to the driving voltage $V_D$ from the power supply section 4. The transmission output of the amplifier 1 is adjusted by an automatic output control means (APC) 10 in accordance with the demand from a control section 14 to be outputted at a desired level in six steps (P1>P2>P3>P4>P5>P6) between a maximum transmission output P1 and a minimum output P6. The APC10 is provided with a feedback signal which is a detected voltage from a detection section 11 detecting a portion of the transmission output of the amplifier 1, thereby the transmission output being maintained substantially constant. The output of the amplifier 1 is transmitted through a duplexer 17.

The mobile radio communication apparatus further includes a memory section 12 for storing data used for adjusting the driving voltage $V_G$ applied by the negative power supply 5 to the gate side of the rear stage amplifying device 3 in accordance with the driving voltage $V_D$ from the power supply 4. FIG. 2 shows an example of the data stored in the memory section 12. In this example, the driving voltage $V_G$ at a negative potential is adjusted in two steps in accordance with the driving voltage $V_D$, that is, a control data signal "A" is produced when $V_D \geq V_{TH}$ ($V_{TH}$ is a threshold data signal) and a control data signal "B" is produced when $V_D < V_{TH}$.

Figure 3:
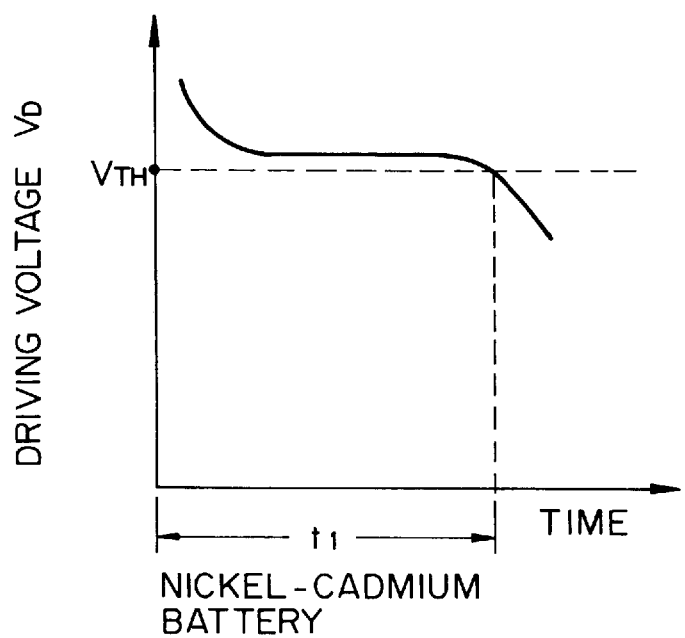
FIG. 3 is a graph illustrating voltage-versus-time characteristics of a nickel-cadmium storage battery.

Now, the relation between the threshold data and the driving voltage control data will be explained. Since the nickel-cadmium battery is used for the power supply 4 in this embodiment, those data should be selected on the basis of the characteristics of such a kind of battery. FIG. 3 is a graph illustrating voltage-versus-time characteristics of a nickel-cadmium battery, that is, the quadrature axis represents the time and the ordinate axis represents the internal voltage of the battery which is supplied to the amplifier as the driving voltage $V_D$. As understood from FIG. 3, the driving voltage $V_D$ does not substantially change from the start of use to a given time ($t_1$) and gradually decreases after the lapse of time $t_1$. Thus, the driving voltage $V_D$ is relatively high until the lapse of $t_1$ and the power supply 4 can afford to supply the amplifier with the driving voltage $V_D$ sufficient to produce a desired transmission output. After the lapse of time $t_1$, however, the driving voltage $V_D$ decreases so that a desired high level output cannot be obtained.

The threshold value $V_{TH}$ of the driving voltage $V_D$ shown in FIG. 3 is determined by considering whether the desired transmission output can be obtained from the amplifier 1 or not and the threshold data on the basis of the threshold value $V_{TH}$ are stored in the memory section 12.

The driving voltage control data are used for adjusting the driving voltage $V_G$ applied to the gate side of the amplifying device 3 from the negative power supply 5 in accordance with the driving voltage $V_D$ from the power supply 4. As a result, the control data signal when the driving voltage $V_D$ is larger than the threshold value $V_{TH}$ ($V_D \geq V_{TH}$) is different from that when the $V_D$ is smaller than $V_{TH}$ ($V_D < V_{TH}$). It is preferable that the control data are previously obtained by an experiment in which the relation between the driving voltage $V_D$ of the power supply 4 and the dissipating current upon producing the transmission output are measured as a function of the driving voltage $V_G$. The control data are selected on the basis of the values of the driving voltage $V_G$ when desired transmission outputs are obtained and the dissipating currents are minimum in the experiment.

In FIG. 1, the apparatus further includes an analog-digital (A/D) converter 13 which detects the driving voltage $V_D$ of the power supply 4 and converts the detected analog voltage into a digital voltage. The digital voltage data of the driving voltage $V_D$ are sent to the control section 14 which compares the driving voltage $V_D$ with the threshold data stored in the memory section 12 and reads the desired driving voltage control data "A" or "B" out of the memory section 12 on the basis of the comparison. The control section 14 also instructs the APC10 of the transmission output level in accordance with the command data from a base station.

The adjustment of the driving voltage $V_G$ in the two steps is carried out by a switching device 15. The voltage $V_G$ applied to gate side of the amplifying device 3 is adjusted in the two steps in dependence on the close and open states of the switching device 15. The state of the switching device 15 is controlled through a port 16 which produces a High level signal or Low level signal in accordance with the driving voltage control data read out by the CPU14. The combination of the negative power supply 5, the resistors 8 and 9, the switching device 15 and the port 16 functions as a driving voltage control means.

Figure 4:
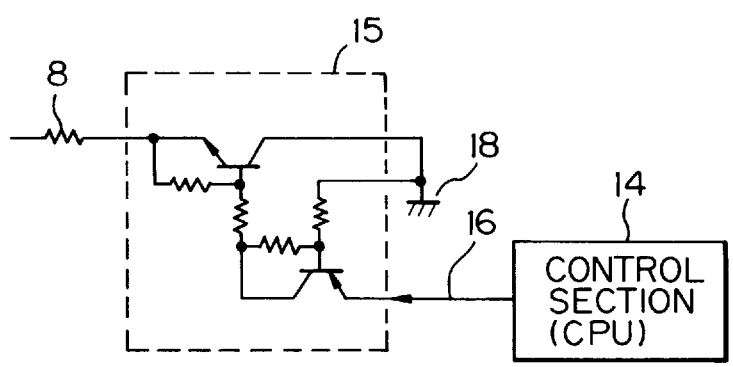
FIG. 4 is a schematic diagram of an example of a switching means shown in FIG. 1.

A concrete example of the switching device 15 is shown in FIG. 4. As shown, the resistor 8 is selectively connected to the ground 18 in accordance with the ON/OFF condition of the switching device 15 in dependence on the High/Low level of the port 16 controlled by the CPU14.

In operation, when a command signal transmitted from a base station is received by the mobile radio communication apparatus shown in FIG. 1, the CPU14 instructs the APC10 of the transmission output level in accordance with the received command data. The APC10 controls the output of the transmission amplifier 1 in response to the instruction of the CPU14. The APC10 also responds to the feedback signal of detection voltage from the detector 11 to keep constant the transmission output level.

Figure 5:
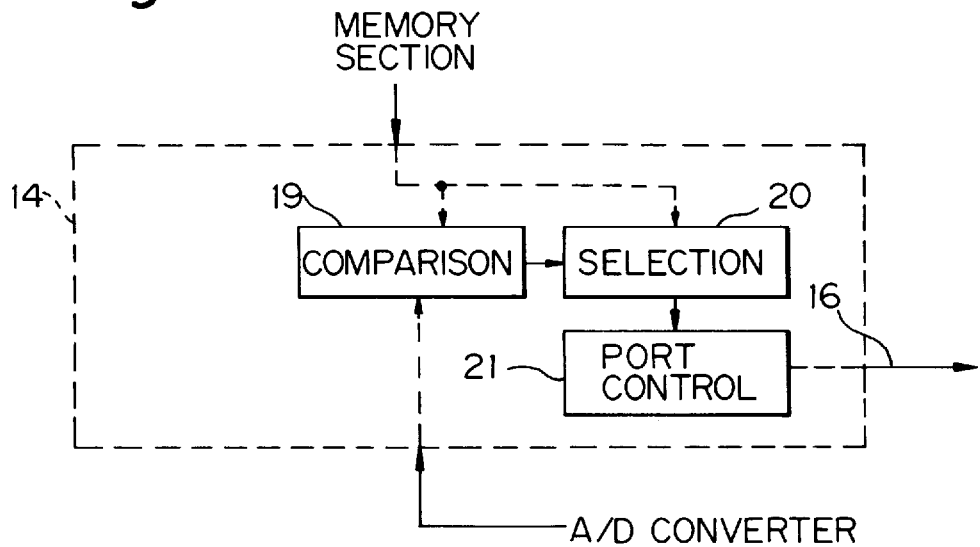
FIG. 5 is a functional block diagram of a control section shown in FIG. 1.

In addition to the instruction of the transmission output level to the APC10, the CPU14 carries out the control on the basis of the driving voltage $V_D$. FIG. 5 is a functional block diagram illustrating the functions of the CPU14. In FIG. 5, the CPU14 includes a comparison section 19, a selection section 20, and a port control section 21.

Figure 6:
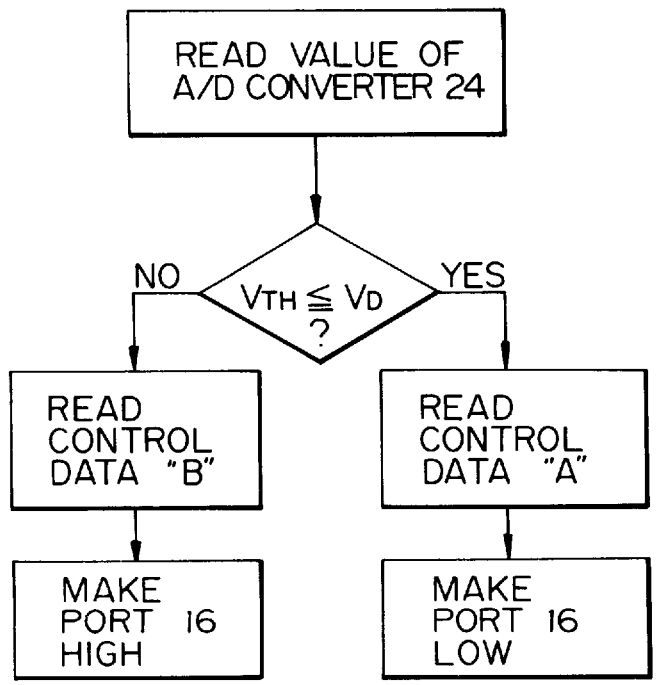
FIG. 6 is a flowchart showing a control sequence executed by the control section.

The operation of the mobile radio communication according to the present invention will be explained in connection with FIG. 5 and the flowchart shown in FIG. 6. First, the comparison section 19 compares the voltage data based on the driving voltage $V_D$ of the power supply 4 and supplied from the A/D converter 13 with the threshold data read out of the memory section 12. The selection section 20 reads out the desired driving voltage control data "A" or "B" in accordance with the results of the comparison. More particularly, if the voltage data signal is greater than the threshold ($V_D \geq V_{TH}$), the selection section 20 reads the driving voltage control data "A". Next, the port control section 21 causes the port 16 to generate the Low level signal in response to the read out control data. On the other hand, if the voltage data signal is smaller than the threshold ($V_D < V_{TH}$), the selection section 20 reads the driving voltage control data "B". Then, the port control section 21 causes the port 16 to generate the High level signal. Thus, the CPU14 makes the port 16 High or Low in response to the change of the driving voltage $V_D$.

The switching device 15 is controlled by the CPU14 through the port 16. For example, if the port 16 is changed from the Low level to the High level by the CPU14, the switching device 15 (FIG. 4) connects the resistor 8 to the ground 18. The driving voltage $V_G$ applied to the amplifying device 3 is controlled by the connection/disconnection of the resistor 8 to/from the ground 18 to determine the driving range of the transmission amplifier 1. Even if the driving voltage $V_D$ from the power supply decreases after the lapse of a certain time period, a desired transmission output can be obtained by reducing the absolute value of the driving voltage $V_G$ applied to the gate side of the amplifying device 3 from the negative power supply 5.

When the driving voltage $V_D$ of the power supply 4 is relatively high, the desired transmission output can be obtained and the driving voltage $V_G$ is adjusted by selecting the parameters such as the resistance of the resistors in such a manner that the dissipating current of the transmission amplifier 1 is minimized. As a result, any heat sink is not necessary when the mobile radio communication apparatus is used because the dissipating current is always made minimum. Further, even when the driving voltage of the power supply 4 decreases, the desired transmission output can be obtained without replacing the power supply.

As explained above, the values of the driving voltage $V_G$ for minimizing the dissipating current of the amplifier as a function of the voltage $V_D$ with keeping the desired transmission output are previously obtained by, for example, an experiment and the control data based on the obtained values are stored in the memory section 12. During the operation of the communication apparatus, the CPU 14 controls the value of the driving current $V_G$ actually applied to the amplifier 1 on the basis of the control data corresponding to the detected driving voltage of the power supply 4, whereby the dissipating current of the amplifier 1 is always minimized.

In the above embodiment, the nickel-cadmium rechargeable battery is used for the power supply 4. Other type of batteries may be used to obtain meritorious effects by controlling the driving voltage $V_G$ of the negative voltage source 5. In this case, the threshold data and control data should be determined in accordance with the characteristics of the used type of battery. For example, although a lithium-ion-system rechargeable battery is more expensive than a nickel-cadmium battery, the life of the former is longer than the latter of the same volume. Thus, the lithium-ion-system battery is suitable for a small size and light weight mobile radio communication apparatus.

Figures 7, 8:
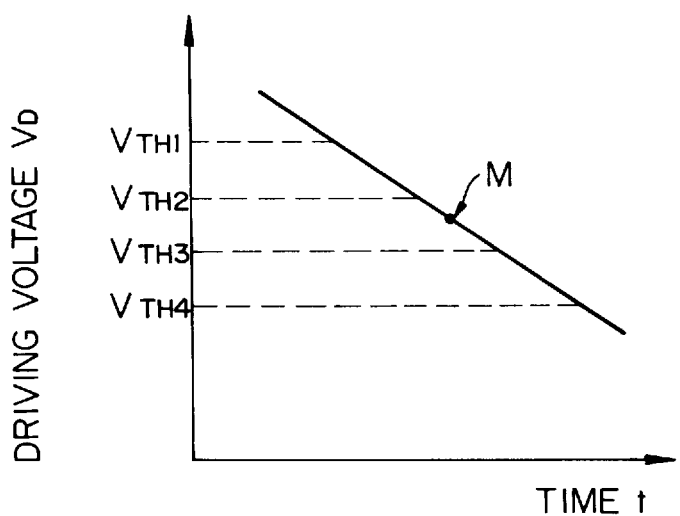
FIG. 7 is a graph illustrating voltage-versus-time characteristics of a lithium-ion-system chargeable battery.
FIG. 8 shows an example of control data for controlling a transmission amplifier in another embodiment of the present invention.

Next, another embodiment in which the lithium-ion-system battery is used will be explained. FIG. 7 shows voltage-versus-time characteristics of a lithium-ion-system rechargeable battery, wherein the driving voltage $V_D$ changes with the lapse of time in inverse proportion. When a battery having such characteristics is used for the power supply, the driving voltage $V_D$ may decrease during communication. Thus, if the driving voltage $V_G$ for controlling the driving range of the transmission amplifier 1 is fixed correspondingly to a relatively high driving voltage $V_D$, the voltage $V_D$ decreases in a shorter time than the nickel-cadmium battery so that the desired transmission output cannot be obtained sooner.

In view of the circumstances, a plurality of threshold values ($V_{TH1}$, $V_{TH2}$, $V_{TH3}$, $V_{TH4}$) are selected as shown in FIG. 7. The driving voltage control data are prepared on the basis of these threshold values. Here, it should be noted that the more number of the threshold values are selected, the more the control data will be suitable in order to keep the dissipating current minimum.

FIG. 8 shows an example of control data for controlling the driving voltage $V_G$ in the case of using a lithium-ion-system rechargeable battery. The driving voltage control data signals $M_1$, $M_2$, ... $M_{n+}$ are set for ranges determined by the threshold data signals $V_{TH1}$, $V_{TH2}$, ... $V_{THn}$. The control data shown in FIG. 8 are stored in the memory section 12 and the CPU 14 read out a desired data signal in accordance with the driving voltage $V_D$.

If the number of threshold values increase in order to control the driving voltage $V_G$ in many steps, the control of the dissipating current of the transmission amplifier 1 can be optimized, but the corresponding number of driving voltage control means for providing the amplifier 1 with the driving voltage $V_G$ adjusted correspondingly to the number of control data are necessary. Each of the driving control means comprises resistors, a switching device, and a port.

Figure 9:
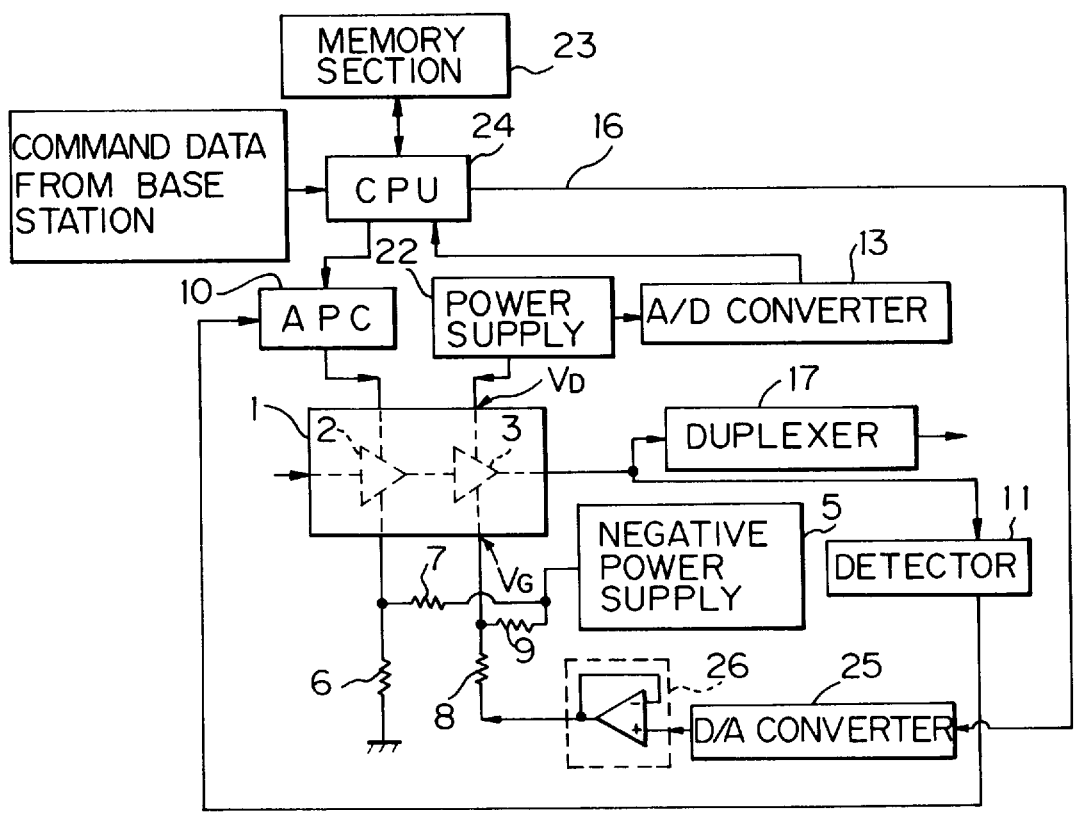
FIG. 9 is a structural block diagram of a mobile radio communication apparatus according to another embodiment of the present invention.

It is often desirable for the mobile radio communication apparatus to be small in size and light weight. FIG. 9 is a block diagram of a mobile radio communication apparatus according to another embodiment of the present invention in which the driving voltage $V_G$ can be controlled in many steps without complicating the driving voltage control means. In FIG. 9, the components labeled the same reference numerals as FIG. 1 denote similar components. The radio communication apparatus of this embodiment comprises a power supply 22 using a lithium-ion-system battery which has characteristics such as shown in FIG. 7, a memory section 23 storing threshold data and driving voltage control data such as shown in FIG. 8 which are previously prepared on the basis of the voltage-time characteristics of the power supply 22, a control section (CPU) 24 instructing an APC 10 of the transmission output level in accordance with command data sent from a base station and reading the driving voltage control data out of the memory section 23 for adjusting the driving voltage $V_G$ from a negative power supply 5 applied to the gate side of a rear stage amplifying device 3 in accordance with the change of the driving voltage $V_D$ of the power supply 22, a digital-to-analog (D/A) converter 25 converting the control data read out of the memory section 23 into an analog control signal, and a voltage follower 26 producing a positive potential corresponding to the read-out driving voltage control data in response to the output of the D/A converter 25. In this embodiment, the switching device 15 shown in FIG. 1 is replaced with the D/A converter 25 and the voltage follower 26. With this arrangement, the driving voltage $V_G$ corresponding to the change of the driving voltage $V_D$ of the power supply 22 is supplied to the transmission amplifier 1 by providing a resistor 8 connected to the voltage follower 26 with the positive potential corresponding to the read-out driving voltage control data.

For example, if the detected driving voltage $V_D$ applied to the A/D converter 13 is at point M in FIG. 7, the CPU 24 reads the driving voltage control data signal $M_3$ (FIG. 8) from the memory section 23. The analog output of the D/A converter 25 on the basis of the control data signal $M_3$ is supplied to the voltage follower 26 which produces a positive potential corresponding to the control data signal $M_3$ for adjusting the driving voltage $V_G$. It is necessary for the control data signal $M_3$ to be determined so as to produce the driving voltage $V_G$ in such a manner that the dissipating current of the amplifier is minimized by the negative potential applied from the negative power supply 5 to the amplifier 1 in response to the positive potential at the same time as obtaining a desired transmission output.

In the above embodiment, the driving voltage $V_G$ is adjusted on the basis of only the change in the driving voltage $V_D$ in order to control the driving range of the transmission amplifier 1. The following embodiment controls the driving voltage $V_G$ suitably in accordance with the change in the transmission output instructed by command data from the base station as well as the change in the driving voltage $V_D$ of the power supply.

Figure 10B:
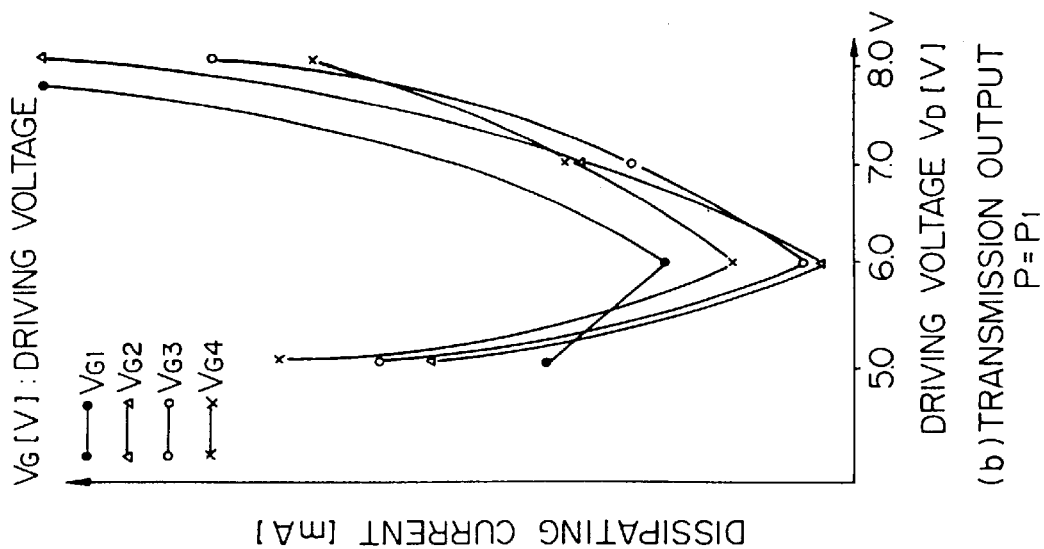
FIGS. 10(a) and 10(b) show graphs illustrating dissipating current-versus-voltage characteristics of a transmission amplifier in another embodiment of the present invention.
Figure 10A:
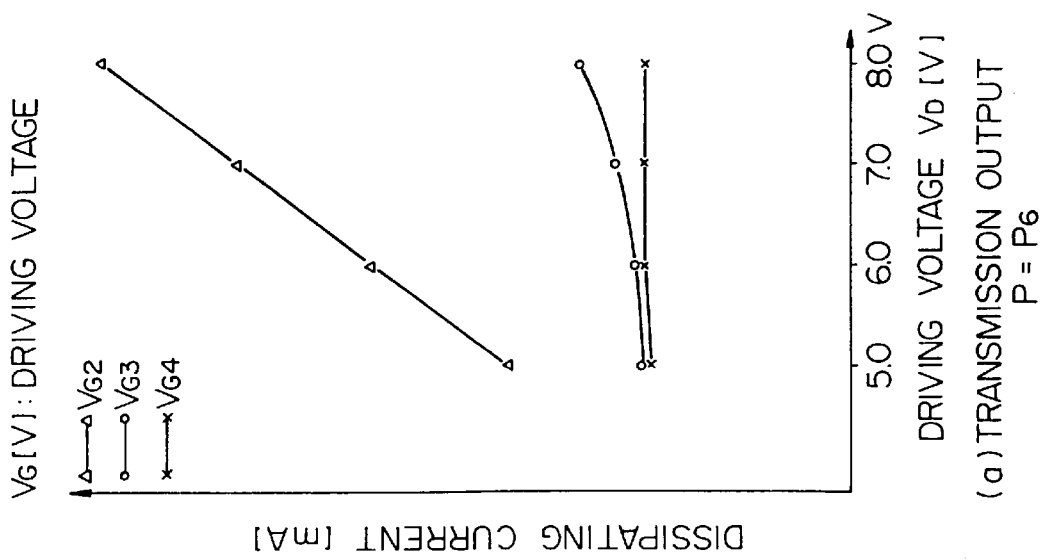

FIGS. 10(*a*) and 10(*b*) show dissipating current characteristics of the transmission amplifier 1 in cases of (a) the transmission output P=$P_6$ and (b) P=$P_1$, respectively, wherein the quadrature axis represents the time and the ordinate axis represents the dissipating current. The dissipating current varies as the driving voltage $V_G$ changes as shown in FIG. 10 shows the dissipating current characteristics when $V_G$ is $V_{G1}$, $V_{G2}$, $V_{G3}$, and $V_{G4}$ ($V_{G1}$>$V_{G2}$>$V_{G3}$>$V_{G4}$). As shown, the dissipating current characteristics of the amplifier 1 significantly differs when the transmission output changes. For example, in the case of the driving voltage $V_D$ being 7.0 [V], the dissipating current of the amplifier 1 is minimized by setting the driving voltage $V_G=V_{G4}$ when the transmission output P on the basis of the command data from the base station is $P_6$. However, when the commanded output P is $P_1$, the driving voltage $V_G$ should be $V_{G3}$ in order to minimize the dissipating current. Thus, it is desirable for the driving voltage control data to be selected and stored in view of the change in the driving voltage $V_D$ as well as the change in the transmission output P of the amplifier 1 in order to keep the minimum dissipating current.

Figure 11:
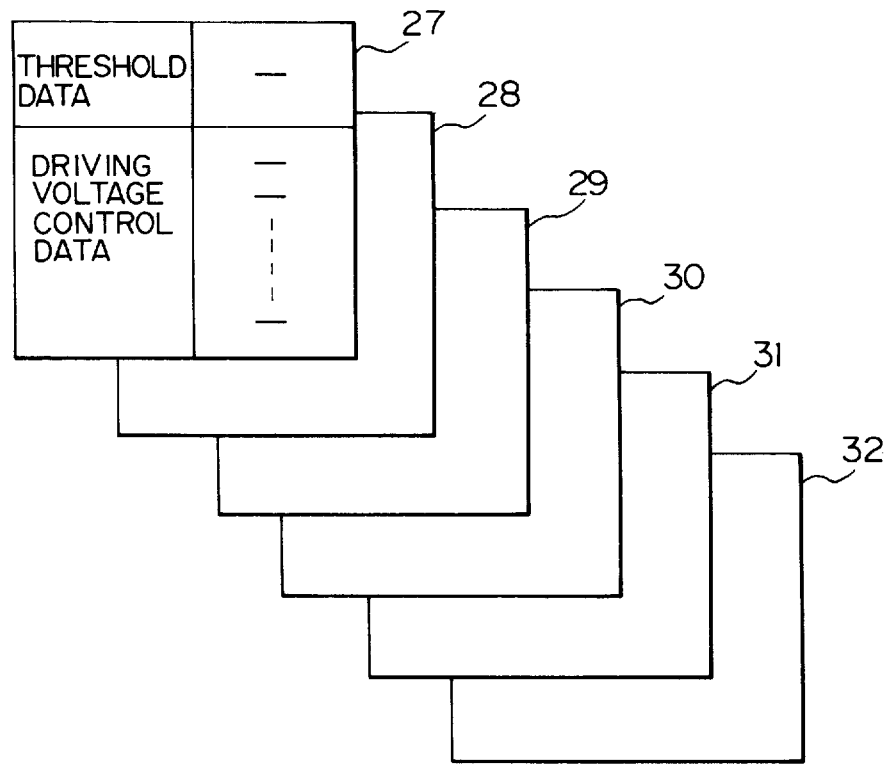
FIG. 11 shows an example of control data for controlling a transmission amplifier in another embodiment of the present invention.

FIG. 11 shows a structure of control data prepared in consideration of the changes in the driving voltage $V_D$ and the transmission output P. In FIG. 11, the data include data 27 for P=$P_1$, and data 28–32 for P=$P_2$, $P_3$, $P_4$, $P_5$ and $P_6$, respectively. Those data 27–32 are previously determined by the dissipating current characteristics of various transmission outputs ($P_1$–$P_6$) such as shown in FIG. 10 on the basis of an experiment and stored in the memory section 23 in the similar manner to the embodiments described above.

Thus, the dissipation current of the transmission amplifier 1 is always made minimum for each of the various transmission outputs by previously storing the data for the various outputs in the memory and controlling the driving voltage $V_G$ in many steps ($P_1$–$P_6$) In this case, the CPU24 should identify the data corresponding to the output instructed by the command data from the base station first, and then read the desired control data signal from the identified data.

Figure 12:
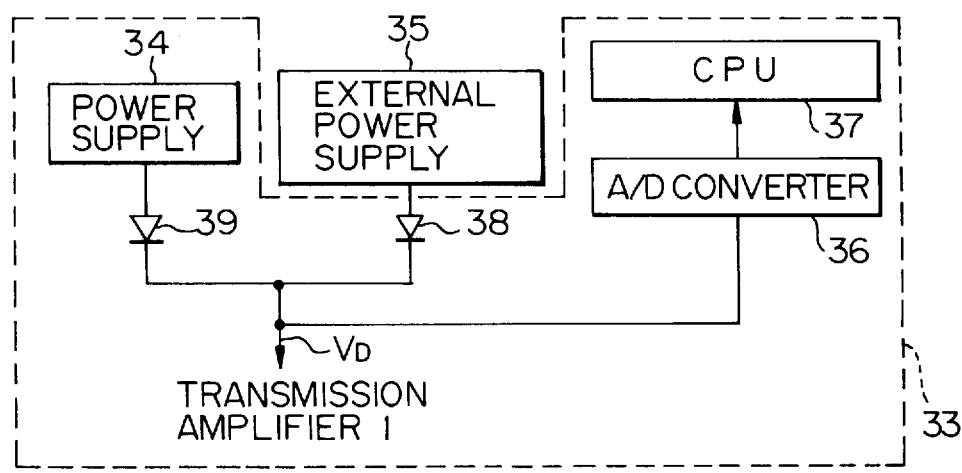
FIG. 12 is a simplified block diagram of a mobile radio communication apparatus according to another embodiment of the present invention.

FIG. 12 shows another embodiment of the present invention. In the above embodiments, the mobile radio communication apparatus is a portable type using a portable battery such as a battery pack for the power supply. In this embodiment, the mobile communication apparatus may be installed in a vehicle or portable. FIG. 12 is a simplified block diagram of a mobile radio communication apparatus 33 used both as a portable type and an on-board type. In FIG. 12, the apparatus 33 is powered by an internal power supply 34 which may be a rechargeable battery such as a battery pack and an external power supply 35 which may be a battery installed in the vehicle. The apparatus 33 comprises an A/D converter 36 detecting the driving voltage $V_D$ supplied to a transmission amplifier 1 and converting the detected voltage into the corresponding digital signal. The other circuit portions connected to the A/D converter 36 are not shown, but those may be arranged similarly to the above embodiments. A control section (CPU) 37 adjusts the driving voltage $V_G$ supplied to the transmission amplifier 1 from the negative power supply in accordance with the output of the A/D converter 36 and the command data from the base station. The driving voltage $V_D$ from the power supply 34 or the external power supply 35 is unidirectionally provided to the amplifier 1 through a rectifying element (or circuit) 38 or 39. Preferably, the voltage of the on-board power supply 35 is higher than that of the power supply 34 by a several volts. As a result, when the apparatus 33 is connected to the external power supply 35, the driving voltage $V_D$ of the power supply 35 is provided to the amplifier 1. On the other hand, when the power supply 35 is disconnected, the driving voltage $V_D$ is given by the power supply 34. With such an arrangement, the power of the power supply 34 using a capacity-limited battery pack or the like can be saved and the life thereof can be extended.

The CPU37 is provided with a memory section (not shown) which stores internal power supply data for the power supply 34 and external power supply data for the power supply 35. The internal power supply data are prepared on the basis of the dissipation current characteristics for various transmission output levels of the amplifier 1 in accordance with the kind of rechargeable batteries used for the power supply 34. The external power supply data are prepared on the basis of the dissipation current characteristics for various transmission output levels of the amplifier 1 in accordance with the driving voltage $V_D$ from the power supply 35. The external power supply data are used when the apparatus 33 is coupled to the external power supply 35 via a connector (not shown) and the internal power supply data are used when the external power supply 35 is disconnected to adjust the driving voltage $V_G$ applied to the amplifier 1 from a negative power supply. Thus, the external power supply data are also stored in the memory section, when the apparatus is used within the vehicle and the driving voltage $V_D$ from the power supply 35 is relatively high, the driving voltage $V_G$ is changed in such a manner that the absolute value of $V_G$ is larger than that of $V_G$ when the internal power supply 34 is used, whereby the dissipating current of the amplifier 1 is kept minimum.

As explained above, according to the present invention, the driving range of a transmission amplifier can be controlled in accordance with prestored control data in such a manner that the dissipation current of the amplifier is kept minimum and a high transmission output level is maintained without a heat sink even if the driving voltage of the power supply reduces.

On the basis of the described preferred embodiments of the invention, it will be apparent to those skilled in the art that many changes and modifications may be made without departing from the concepts of the invention.

What is claimed is:

1. A mobile radio communication apparatus comprising:
   a power supply;
   a transmission amplifier provided with a driving voltage from said power supply for providing a transmission output;
   a memory storing reference data for evaluating the driving voltage from said power supply and control data for controlling the driving range of said transmission amplifier;
   a controller comparing voltage data based on the driving voltage detected from said power supply with the reference data stored in said memory and reading the corresponding control data out of said memory in accordance with the comparison; and
   a driving range control means for receiving the read out control data and controlling the driving range of said transmission amplifier in accordance with the read out control data so as to maintain a constant amplifier driving range when said driving voltage from said power supply decreases.

2. A mobile radio communication apparatus recited in claim 1, wherein said power supply comprises a lithium-ion-system battery.

3. A mobile radio communication apparatus comprising:
   a power supply;
   a transmission amplifier provided with a driving voltage from said power supply for producing a transmission output;
   an automatic output control means for adjusting the transmission output of said transmission amplifier in accordance with command data from a base station;
   a memory storing control data for adjusting the driving range of said transmission amplifier for each of the command data, each of the control data corresponding to each of the command data;

a controller reading a desired one of control data out of said memory in accordance with the command data from said base station and voltage data based on the driving voltage detected from said power supply; and a driving range control means for receiving the control data read out by said controller and controlling the driving range of said transmission amplifier in accordance with a control voltage based on the read out control data so as to maintain a constant amplifier driving range when said driving voltage from said power supply decreases.

4. A mobile radio communication apparatus recited in claim 3, wherein said power supply comprises a lithium-ion-system battery.

5. A mobile radio communication apparatus adapted for use as a portable apparatus or an apparatus installed in a vehicle, said apparatus comprising:

a portable power supply;

an on-board power supply disposed within said vehicle;

a transmission amplifier provided with a driving voltage from said portable power supply or said on-board power supply for producing a transmission output;

a power supply switching device for selectively providing said transmission amplifier with the driving voltage of said on-board power supply or the driving voltage of said portable power supply;

a memory storing control data for adjusting the driving range of said transmission amplifier on the basis of the driving voltage from said portable power supply or said on-board power supply;

a controller for reading the control data corresponding to voltage data based on the driving voltage detected from said portable or on-board power supply out of said memory; and a driving range control means for receiving the control data read by said controller and controlling the driving range of said transmission amplifier in accordance with a control voltage based on the read out control data so as to maintain a constant amplifier driving range when said driving voltage from said power supply decreases.

6. A mobile radio communication apparatus recited in claim 5, wherein said power supply comprises a lithium-ion-system battery.

7. A mobile radio communication apparatus comprising:

a power supply which decreases due to the lapse of time;

a transmission amplifier energized by the driving voltage from said power supply;

a memory storing control data which are previously determined by experiment so as to control the desired driving range of said transmission amplifier as a function of the driving voltage from said power supply in such a manner that substantially constant transmission output level is maintained and the dissipating current of said transmission amplifier is minimized; and a controller for detecting the driving voltage and adjusting the driving range of said transmission amplifier in accordance with the control data corresponding to the detected driving voltage so as to maintain a constant amplifier driving range when said driving voltage from said power supply decreases.

* * * * *